United States Patent [19]
Jun

[11] Patent Number: 5,828,083
[45] Date of Patent: Oct. 27, 1998

[54] ARRAY OF THIN FILM TRANSISTORS WITHOUT A STEP REGION AT INTERSECTION OF GATE BUS AND SOURCE BUS ELECTRODES

[75] Inventor: Myung Chul Jun, Kyungki-Do, Rep. of Korea

[73] Assignee: Goldstar Co., Ltd., Seoul, Rep. of Korea

[21] Appl. No.: 616,780

[22] Filed: Mar. 19, 1996

Related U.S. Application Data

[63] Continuation of Ser. No. 396,056, Feb. 28, 1995, abandoned, which is a continuation of Ser. No. 174,022, Dec. 28, 1993, abandoned.

[51] Int. Cl.⁶ .......................... H01L 29/04; H01L 31/036; G02F 1/1343
[52] U.S. Cl. ................... 257/59; 257/72; 359/59
[58] Field of Search .................. 257/57, 59, 66, 257/72, 352, 353; 359/59

[56] References Cited

U.S. PATENT DOCUMENTS

| | | | |
|---|---|---|---|
| 4,816,885 | 3/1989 | Yoshida et al. | 257/59 |
| 4,997,262 | 3/1991 | Sakono et al. | 257/59 |
| 5,021,850 | 6/1991 | Tanaka et al. | 257/59 |

FOREIGN PATENT DOCUMENTS

| | | | |
|---|---|---|---|
| 0349255 | 1/1990 | European Pat. Off. | 257/59 |
| 2-20831 | 1/1990 | Japan | 257/57 |

*Primary Examiner*—Steven H. Loke

[57] ABSTRACT

An array of thin film transistors, which minimizes a stepped part in a cross-over region between a gate bus line and a source bus line. Each thin film transistor in the array has associated therewith a structure which includes: a gate bus electrode located on a substrate surface, a first insulating layer covering the gate bus electrode and the substrate surface, a non-monocrystalline semiconductor layer on the first insulating layer above the gate bus electrode, a second insulating layer on the non-monocrystalline semiconductor layer above the gate bus electrode, an n+ monocrystalline layer on the second insulating layer and the non-monocrystalline layer, and a source bus electrode on the n+ monocrystalline layer. A bus line structure in the array is fabricated by the process described above. In the bus line structure, each of the non-monocrystalline semiconductor layer, the second insulating layer, and the n+ non-monocrystalline semiconductor layer is patterned in the same direction as the source bus line. Additionally, the second insulating film is made wider than the source bus line and both the non-monocrystalline semiconductor layer and the n+ non-monocrystalline semiconductor layer are made wider than the second insulating layer.

10 Claims, 6 Drawing Sheets

FIG. 3A
CONVENTIONAL ART
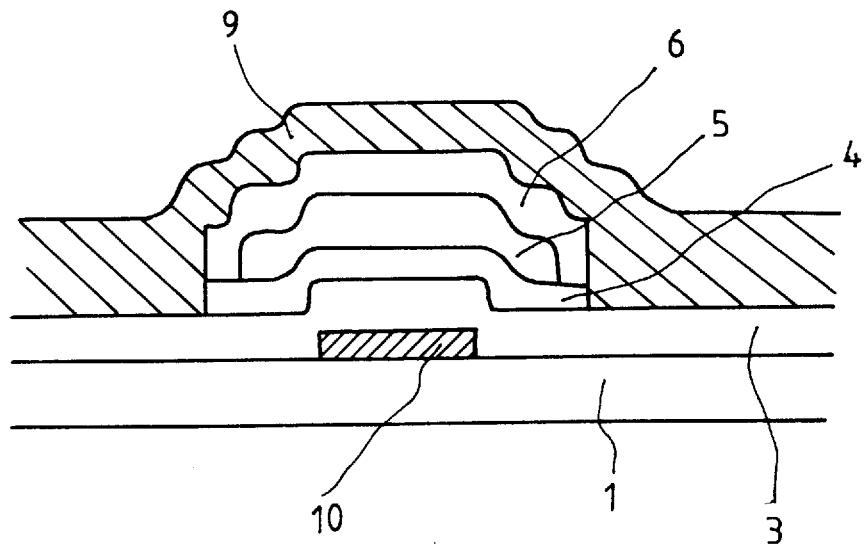
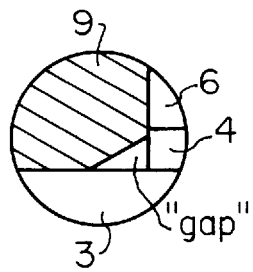
FIG. 3B CONVENTIONAL ART
FIG. 4A
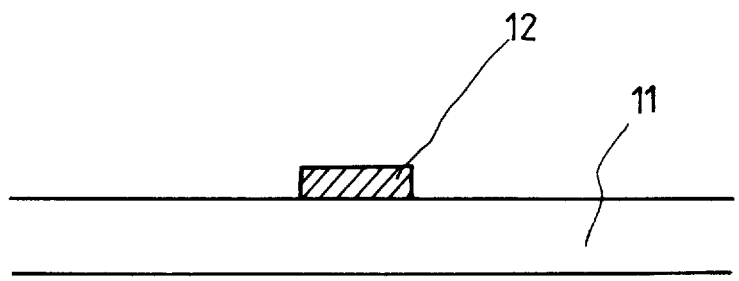

ARRAY OF THIN FILM TRANSISTORS WITHOUT A STEP REGION AT INTERSECTION OF GATE BUS AND SOURCE BUS ELECTRODES

This application is a continuation, of application Ser. No. 08/396,056 filed on Feb. 28, 1995, now abandoned; which is a continuation of application Ser. No. 08/174,022 filed Dec. 28, 1993, now abandoned.

BACKGROUND OF THE INVENTION

1. Field of the Invention

The present invention relates, in general, an array of thin film transistor and, more particularly, to a bus line structure of a thin film transistors, lacking of a stepped part in a cross region between a gate bus electrode and a source bus electrode.

2. Description of the Prior Art

Description of a conventional fabrication method for an array of thin film transistors, along with the problems generated therefrom, follows for better understanding of the background of the present invention, with reference to some figures.

Referring initially to FIGS. 1A through 1E, there are illustrated the conventional processes for fabricating a thin film transistor in the array.

Firstly, on an insulating substrate 1, such as glass, quartz and the like, there is deposited a material for a gate electrode, which is subsequently subjected to patterning, to form a gate electrode 2, as shown in FIG. 1A.

Thereafter, on the surface consisting of the insulating substrate 1 and the gate electrode 2, there are deposited a first insulating layer 3, a non-monocrystalline semiconductor layer 4 and a second insulating layer 5, in due order, and the second insulating layer 5 is selectively etched by means of photoresist, to form a pattern, rectangular in cross sections as, shown in FIG. 1B.

Subsequently, on the surfaces provided by both of the non-monocrystalline semiconductor layer 4 and the second insulating layer 5, there is deposited an n$^+$ non-monocrystalline semiconductor layer 6 containing a group V impurity, and then, a photo etching process is applied to the n$^+$ non-monocrystalline semiconductor layer 6 and the non-monocrystalline semiconductor layer 4, to form a pattern, as shown in FIG. 1C.

Next, on the surface provided by the patterned first insulating layer 3 and the patterned n$^+$ non-monocrystalline semiconductor layer 4, there is deposited a transparent electrode material, which is to be subjected to a photo etching process, to form a transparent electrode 7 to be used as a picture cell electrode, as shown in FIG. 1D.

Finally, on the surface provided by the first insulating film 3, the n$^+$ non-monocrystalline semiconductor layer 6 and the transparent electrode 7, there is deposited a material for a source-drain electrode, to which a photo etching process using a photoresist is subsequently applied, to form a source-drain electrode 8 (as shown in FIG. 2), and using the source-drain electrode 8 as a mask, the n$^+$ non-monocrystalline layer 6 of the is etched, so that a thin film transistor is fabricated, as shown in FIG. 1E.

Referring now to FIG. 2, there is shown one of a bus line structure in the array fabricated by the processes described above. As shown in this figure, there is a cross region between a source bus line 9 and a gate bus line 10.

Turning now to FIG. 3, there is a schematic cross-sectional view showing the cross region between the source bus line 9 and the gate bus line 10, taken generally through section line A–A' of FIG. 2.

Is show in FIGS. 2 and 3 the conventional array of thin film transistors the non-monocrystal line semiconductor layer 4, the insulating layer 5, and the n$^+$ non-monocrystalline semiconductor layer 6 insulating layer 5 all of which are patterned in the cross region between the source bus line 9 and the gate bus line 10, as described above. The second insulating layer 5 is wider than the source bus line 9 and is narrower than the non-monocrystalline semiconductor layer 4 and the n$^+$ non-monocrystalline semiconductor layer 6, and the patterned second insulating layer 5 is formed in the cross region between the gate bus line 10 and the source bus line 9.

That is, since the non-monocrystalline semiconductor layer 4, the second insulating layer 5 and the n$^+$ non-monocrystalline semiconductor layer 6 are as shown in FIG. 2, patterned in the form of an island between the first insulating layer 3 and the source-drain electrode, the stepped layers are formed in the intersection region between the gate bus line 10 and the source bus line 9. These stepped layers are illustrated in FIG. 1E in cross-section between gate electrode 2 and source-drain electrode 8 as well as between the gate electrode 2 and source bus line 9. When the source-drain electrode 8 is subjected to the treatment of etching, an etching solution flows onto the source bus electrode 9 through a small opening formed at the stepped part, causing the source bus line 9 to be etched. As a result, the scarce bus line may be damaged so as to cause an open circuit which lowers the production yield.

SUMMARY OF THE INVENTION

Therefore, an object of the present invention is to solve the problems encountered in the prior art and to provide an array of thin film transistors: and damage to the source bus line and thus to improve the production yield.

In accordance with the present invention the above object can be accomplished by providing an array of thin film transistors, comprising a non-monocrystalline semiconductor layer, first and second insulating layers, an n$^+$ non-monocrystalline semiconductor layer and a source bus electrode, wherein each of said non-monocrystalline semiconductor layer, said second insulating layer, and said n$^+$ non-monocrystalline semiconductor layer are patterned in the same direction as said source bus line, the second insulating layer being wider than said source bus line and both the non-monocrystalline semiconductor layer and the n$^+$ non-monocrystalline semiconductor layer being wider than the second insulating layer.

BRIEF DESCRIPTION OF THE DRAWINGS

Other objects and aspects of the invention will become apparent from the following description of embodiments with reference to the accompanying drawings in which:

FIG. 3A is a schematic cross sectional view bus line structure formed at the intersection of the source bus electrode and gate bus electrode of FIG. 2, taken generally through section line A–A' of FIG. 2;

FIG 3B is an expanded view of the region in FIG. 3A within the circle, and illustrates a gap which may occur at the stepped part, as discussed above.

FIGS. 4A through 4E are schematic cross sectional views illustrating fabrication processes for thin film transistors, according to the present invention;

DETAILED DESCRIPTION OF THE PREFERRED EMBODIMENT

Figure 1A:
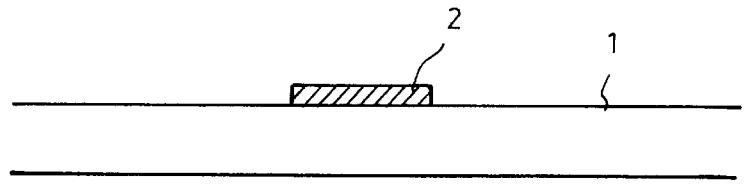
FIGS. 1A through 1E are schematic, cross sectional views illustrating conventional fabrication processes for thin film transistors.
Figure 1B:
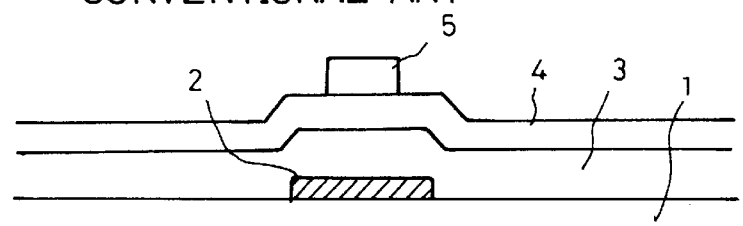
Figure 1C:
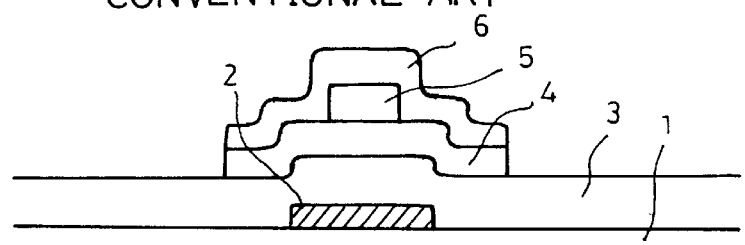
Figure 1D:
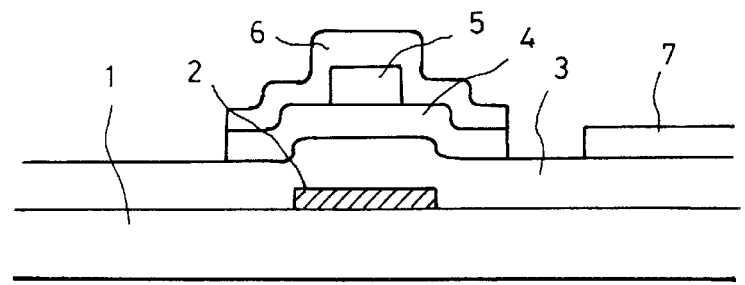
Figure 1E:
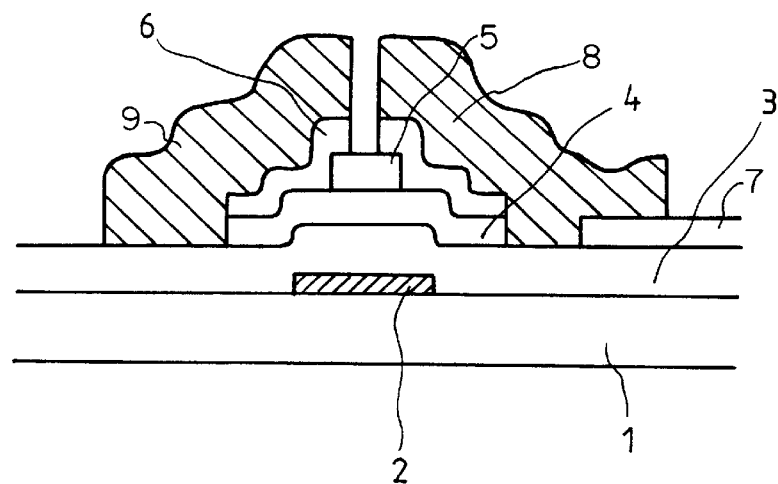
Figure 2:
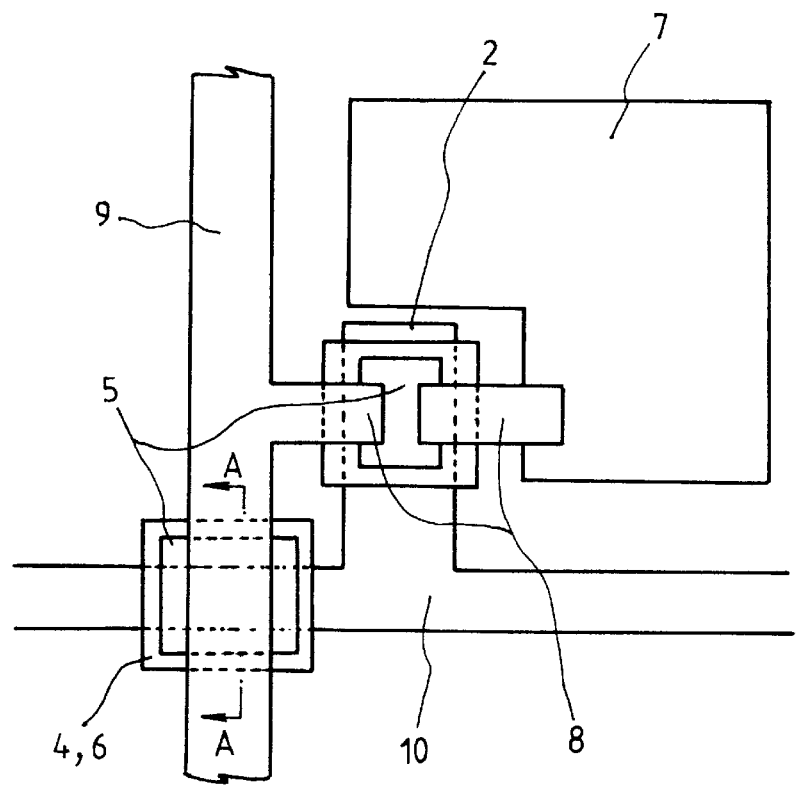
FIG. 2 shows a conventional bus line structure.

Hereinafter, the preferred embodiment of the present invention will be described in detail with reference to the drawings, wherein like reference numerals designate like parts, respectively.

Referring initially to FIGS. 4A through 4E, there are illustrated processes for fabricating one of the thin film transisters in the array of thin film transistor, according to the present invention.

Firstly, on an insulating substrate 11, such as glass, quartz and the like, there is deposited a material for gate electrode, which is subsequently subjected to patterning, to form a gate electrode 12, as shown in FIG. 4A.

Figure 4B:
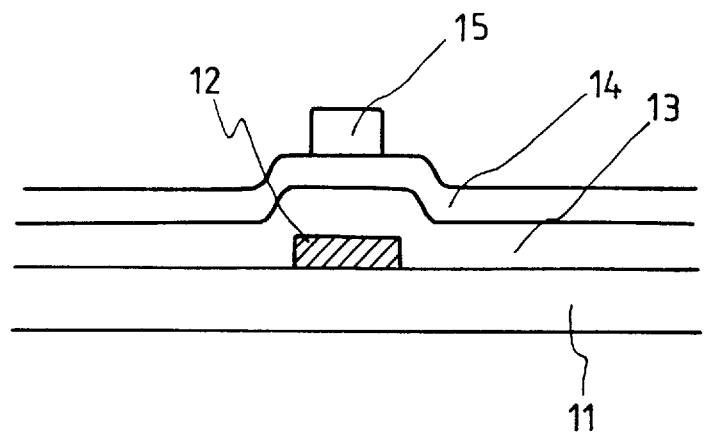

Thereafter, on the surfaces provided by both of the insulating substrate 11 and the gate electrode 12, there are deposited a first insulating layer 13, a non-monocrystalline semiconductor layer 14 and a second insulating layer 15, in due order, and the second insulating layer 15 is selectively etched by means of photoresist, to form a pattern, as shown in FIG. 4B.

Figure 4C:
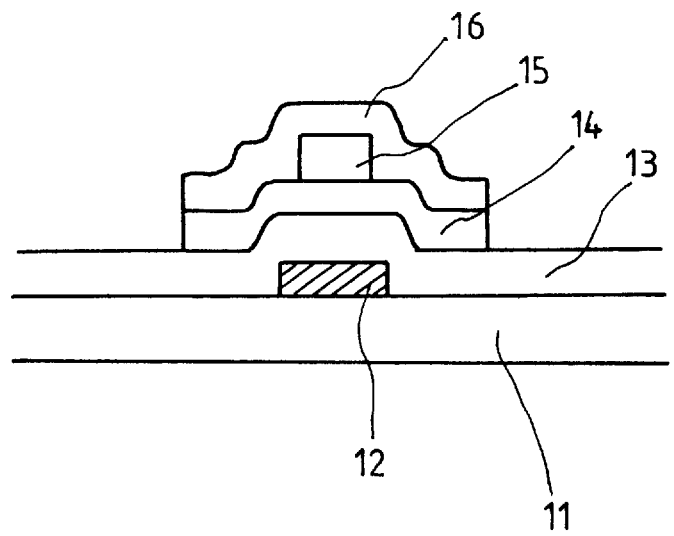

Subsequently, on the surfaces provided by both of the non-monocrystalline semiconductor layer 14 and the second insulating layer 15, there is deposited an $n^+$ non-monocrystalline semiconductor layer 16 containing a group V impurity, and then, a photo etching process is applied to the $n^+$ non-monocrystalline semiconductor layer 16 and the non-monocrystalline semiconductor layer 14, to form a pattern, as shown in FIG. 4C.

Figure 4D:
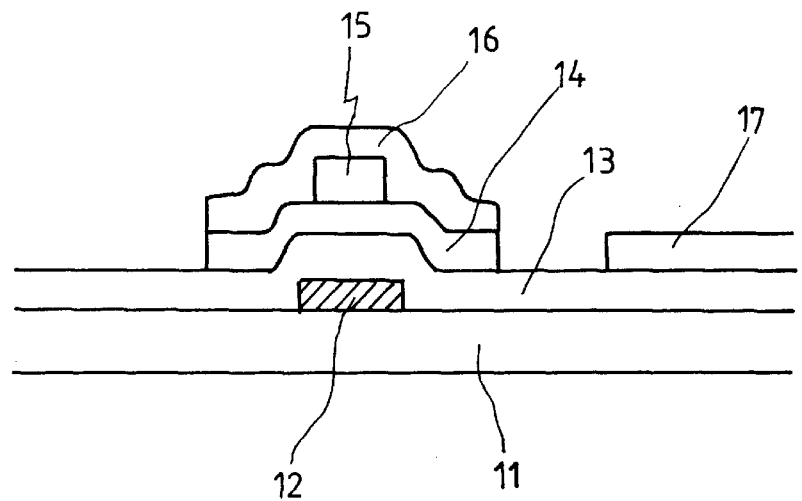

Next, on the surfaces provided by both the first insulating layer 13 and the $n^+$ non-monocrystalline semiconductor layer 16 there is deposited a material for a transparent electrode, which is to be subjected to a photo etching process, to form a transparent electrode 17 to be used as a picture cell electrode, as shown in FIG. 4D.

Figure 4E:
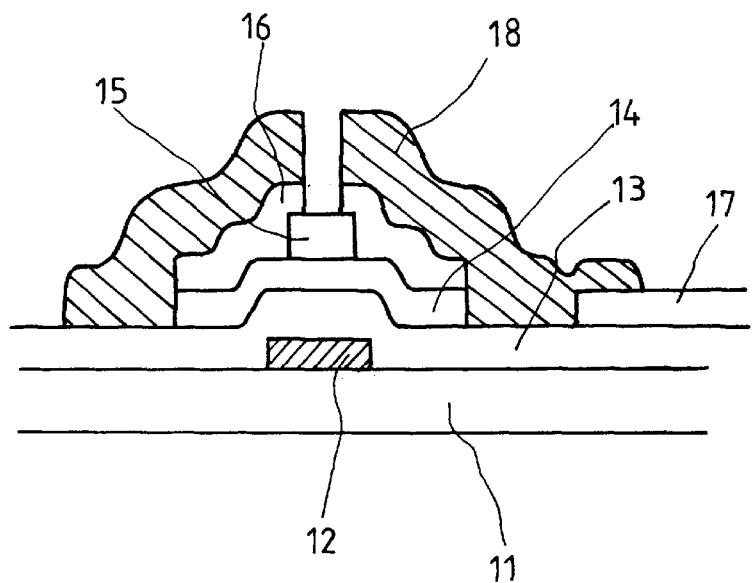

Finally, on the surface provided by the first insulating film 13, the $n^+$ non-monocrystalline semiconductor layer 16 and the transparent electrode 17, there is deposited a material for source-drain electrode, to which a photo etching process using a photoresist is subsequently applied, to form a source-drain electrode 18, and using the source-drain electrode 18 as a mask, the $n^+$ non-monocrystalline layer is etched, so that a thin film transistor is fabricated, as shown in FIG. 4E.

Figure 5:
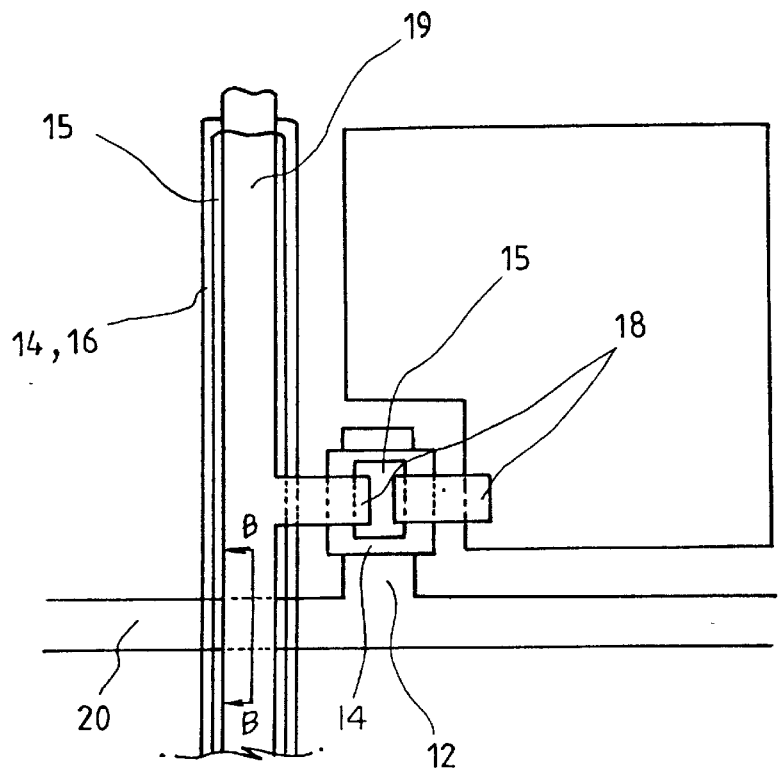
FIG. 5 shows one of the bus line structures according to the present invention.

Referring now to FIG. 5, there is shown one of a bus line structure in the array of the thin film transistors fabricated by the processes described above. As shown in this figure, there is a cross region between a source bus line 19 and a gate bus line 20. The source bus line 19 overlays the $n^+$ non-monocrystalline semiconductor layer 16 covering the second insulating layer 15 atop the non-monocrystalline semiconductor layer 14.

This figure shows that each of the $n^+$ non-monocrystalline semiconductor layer 16, the second insulating layer 15 and the non-monocrystalline semiconductor layer 14 are patterned on the same direction as and extend along substantially an entire length of the source bus line 19, so that they, together with the source bus electrode 19, cross over the gate bus electrode 20.

As illustrated in FIG. 5, the second insulating layer 15 is wider than the source bus line 19, and each of the $n^+$ non-monocrystalline semiconductor layer 16 and the non-monocrystalline semiconductor layer 14 is patterned, and is wider than the second insulating layer 15.

Figure 6:
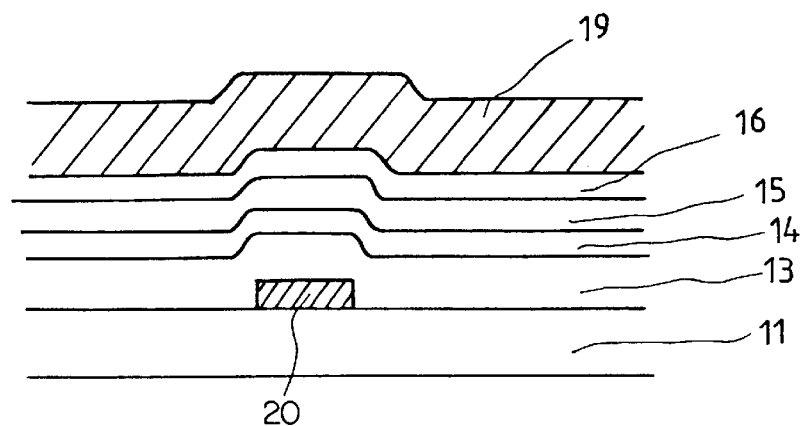
FIG. 6 is schematic cross sectional view showing the bus line structure of FIG. 5, taken generally through section line B–B' of FIG. 5.

Turning now to FIG. 6, there is a schematic cross-sectional view showing the cross region between the source bus electrode 19 and the gate bus electrode 20, taken generally through section line B–S' of FIG. 5.

As shown in this drawing, the $n^+$ non-monocrystalline semiconductor layer 16, the second insulating layer 15 and the non-monocrystalline semiconductor layer 14 are patterned in the same direction as and extend along substantially an entire length of the source bus line 19, so that the generation of stepped part can be minimized at the cross region between the source bus line 19 and the gate bus line 20.

As illustrated hereinbefore, the $n^+$ non-monocrystalline semiconductor layer 16, the second insulating layer 15 and non-monocrystalline semiconductor layer 14 are patterned in the same direction as the source bus line 19 in accordance with the present invention.

In addition, while the second insulating layer 15 is patterned, and is wider than the sources gates bus line 19 each of the non-monocrystalline semiconductor layer 14 and 20 the $n^+$ non-monocrystalline semiconductor layer 16 is patterned, having a width wider than that of the second insulating layer 15, in the array of semiconductor device according to the present invention. As a result of these layers being patterned in the same direction as the source bus line, the generation of stepped part at the cross region between the source bus line and the gate bus line can be minimized.

Consequently, the array of thin film transistor according to the present invention is capable of preventing damage to the source bus line.

Although the preferred embodiment of the present invention has been disclosed for illustrative purposes, those skilled in the art will appreciate that various modifications, additions and substitutions are possible, without departing from the scope and spirit of the present invention as disclosed in the accompanying claims.

What is claimed is:

1. An array of thin film transistors, each thin film transistor having associated therewith a structure comprising:

a gate bus line located on a substrate surface and connected to a gate electrode of the thin film transistor;

a data bus line, arranged perpendicular to and over the gate bus line, and connected to a source electrode of the thin film transistor;

wherein the data bus line is separated from the gate bus line by a plurality of separation layers of material therebetween, each of the separation layers extending substantially along an entire length of the data bus line;

wherein the plurality of separation layers includes:

a first insulating layer on the gate bus line and on said substrate surface;

a semiconductor layer on the first insulating layer;

a second insulating layer on the semiconductor layer; and a doped semiconductor layer on the second insulating layer and the semiconductor layer;

wherein the data bus line is on the doped semiconductor layer;

wherein said second insulating layer is wider than said data bus line; and wherein both of said semiconductor layer and said doped semiconductor layer are wider than said second insulating layer.

2. An array of thin film transistors as in claim 1, wherein said semiconductor layer is non-monocrystalline silicon and said doped semiconductor layer is n$^+$ non-monocrystalline silicon.

3. A flat panel display device comprising:

a plurality of first conductors and second conductors arranged so that the first conductors perpendicularly intersect the second conductors and so that the second conductors are located over the first conductors; and a plurality of pixel elements connected to said second conductors at intersections of the first conductors and the second conductors, respectively;

wherein each second conductor is separated from each first conductor by a plurality of separation layers of material therebetween, each of the separation layers extending substantially along an entire length of the second conductor; and wherein the plurality of separation layers of material includes:

a first insulating layer on the first conductor;

a first semiconductor layer on the first insulating layer;

a second insulating layer on the first semiconductor layer; and a second semiconductor layer over said second insulating layer.

4. A display device as in claim 3, wherein:

at least one of the plurality of separation layers is wider than the second conductor.

5. A display device as in claim 3, wherein:

the second semiconductor layer is doped with an impurity.

6. A display device as in claim 3, wherein:

at least one of the first semiconductor layer, the second insulating layer, the second semiconductor layer is wider than the second conductor.

7. A display device as in claim 6, wherein:

the second insulating layer is wider than the second conductor; and wherein at least one of the first and second semiconductor layers is wider than the second insulating layer.

8. A display device as in claim 3, wherein:

the first and second semiconductor layers are non-monocrystalline silicon.

9. A display device as in claim 3, wherein:

the first conductors are gate lines and the second conductors are data lines.

10. A display device as in claim 3, wherein:

the flat panel display is a liquid crystal display device; and wherein each pixel element includes a thin film transistor connected to one of said first conductors and to one of said second conductors.

* * * * *